United States Patent
Liao et al.

(10) Patent No.: US 9,561,567 B2
(45) Date of Patent: Feb. 7, 2017

(54) WORKPIECE HOLDING DEVICE

(71) Applicants: FU DING ELECTRONICAL TECHNOLOGY (JIASHAN) CO., LTD., Zhejiang (CN); HON HAI PRECISION INDUSTRY CO., LTD., New Taipei (TW)

(72) Inventors: Hong-Gang Liao, Jiashan (CN); Xiao-Yi Wu, Jiashan (CN); Shi-Mei Cai, Jiashan (CN)

(73) Assignees: FU DING ELECTRONICAL TECHNOLOGY (JIASHAN) CO., LTD., Zhejiang (CN); HON HAI PRECISION INDUSTRY CO., LTD., New Taipei (TW)

( * ) Notice: Subject to any disclaimer, the term of this patent is extended or adjusted under 35 U.S.C. 154(b) by 30 days.

(21) Appl. No.: 14/592,106

(22) Filed: Jan. 8, 2015

(65) Prior Publication Data

US 2016/0107278 A1   Apr. 21, 2016

(30) Foreign Application Priority Data

Oct. 15, 2014   (CN) .......................... 2014 2 0595273

(51) Int. Cl.
   *B25B 1/20*   (2006.01)
   *B23Q 3/06*   (2006.01)
   *H01L 21/00*  (2006.01)

(52) U.S. Cl.
   CPC .............. *B23Q 3/061* (2013.01); *B23Q 3/065* (2013.01); *H01L 21/00* (2013.01)

(58) Field of Classification Search
   USPC .......................................... 269/43
   See application file for complete search history.

(56) References Cited

U.S. PATENT DOCUMENTS

| | | | | |
|---|---|---|---|---|
| 2,869,433 A | * | 1/1959 | Dery ...................... | B23Q 3/061 269/154 |
| 5,201,502 A | * | 4/1993 | Schneider ................ | B25B 5/10 269/221 |
| 5,897,108 A | * | 4/1999 | Gordon .............. | H05K 13/0069 269/310 |
| 6,047,958 A | * | 4/2000 | Marinkovic ........... | B23Q 3/061 269/43 |
| 6,711,796 B2 | * | 3/2004 | Su ...................... | H05K 13/0061 269/289 R |

(Continued)

FOREIGN PATENT DOCUMENTS

JP   DE 3226664 A1 *  2/1983   ........... B23Q 1/0018

*Primary Examiner* — Alvin Grant
(74) *Attorney, Agent, or Firm* — Zhigang Ma (57) ABSTRACT

A workpiece holding device includes a main body having a groove and a bearing plate configured to receive a workpiece; an elastic member mounted in the groove at an angle relative to the bearing plate, and having an engaging portion protruding beyond the groove; and a resisting member having an inclined surface received in the groove. The inclined surface can abut the elastic member. When the resisting member rises it forces the engaging portion of the elastic member to move toward the bearing plate, thus securing the workpiece when present. When the resisting member lowers the elasticity of the engaging portion causes it to move away from the bearing plate, thus releasing the workpiece when present.

10 Claims, 6 Drawing Sheets

(56) References Cited

U.S. PATENT DOCUMENTS

| | | | | |
|---|---|---|---|---|
| 7,204,481 B2* | 4/2007 | Sears | ............... | B23K 11/11 269/266 |
| 8,001,667 B2* | 8/2011 | Huang | ............... | G02B 27/62 29/281.1 |
| 8,033,537 B2* | 10/2011 | Wuethrich | ............... | F16B 5/02 269/289 R |
| 2006/0013662 A1* | 1/2006 | Faul | ............... | B23B 49/02 408/3 |
| 2015/0371887 A1* | 12/2015 | Merte | ............... | H01L 21/68728 269/134 |

* cited by examiner

WORKPIECE HOLDING DEVICE

FIELD

The subject matter herein generally relates to industrial handling.

BACKGROUND

Along with the advance of modern science and technology, a plurality of workpieces can be processed into a variety of shapes. To improve the quality of the processing, the plurality of workpieces should first be fastened on a holding device.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising", when utilized, means "including, but not necessarily limited to"; it specifically indicates open-ended inclusion or membership in the so-described combination, group, series and the like.

The present disclosure is described in relation to a workpiece holding device.

Figure 1:
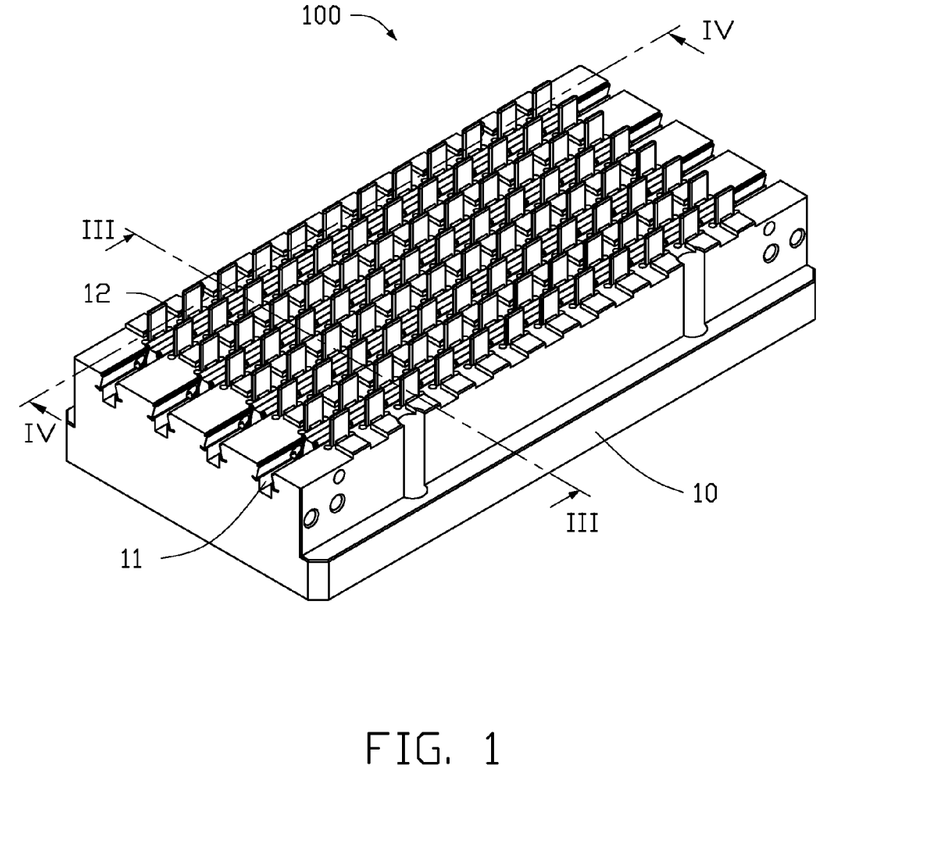
FIG. 1 is an isometric view of an embodiment of a holding device.

FIG. 1 illustrates an isometric view of an embodiment of a holding device 100. The holding device 100 can be configured to fasten a plurality of thin plate workpieces 200 (shown in FIG. 5), and include a rectangular main body 10. The main body 10 can include a plurality of parallel grooves 11 and a plurality of bearing plates 12 configured to receive the plurality of workpieces 200. A cross section of the each groove 11 can be substantially rectangular. The bearing plates 12 can be positioned on two sides of the grooves 11, and each bearing plate 12 can be perpendicular to the main body 10. In the illustrated embodiment, the plurality of bearing plates 12 and the main body 10 can be formed integrally.

Figure 2:
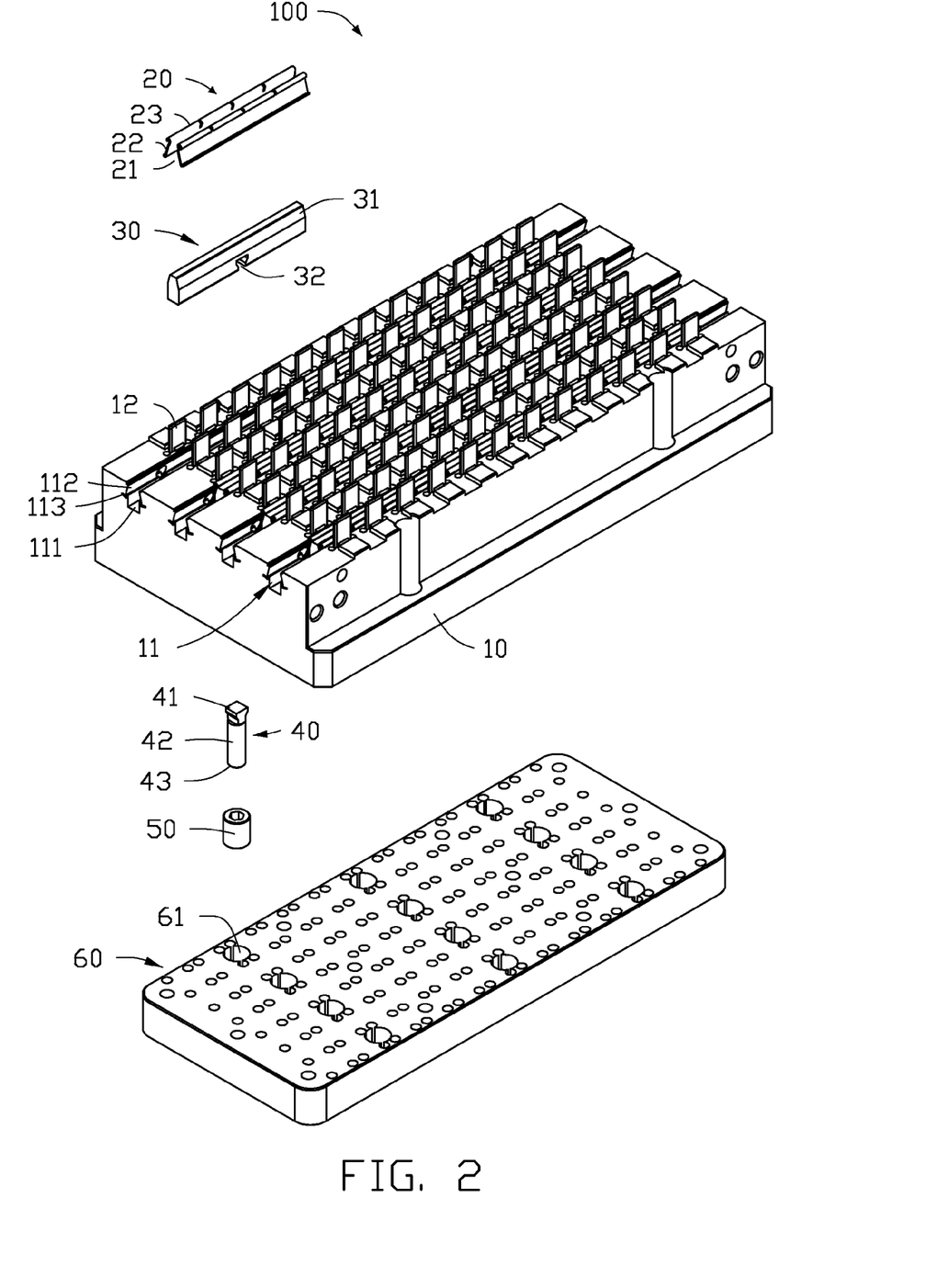
FIG. 2 is an exploded, isometric view of the holding device of FIG. 1.

FIG. 2 illustrates an exploded, isometric view of the holding device 100. The holding device 100 can also include a plurality of elastic members 20, a plurality of resisting members 30, a plurality of adjusters 40; a plurality of regulating nuts 50, and a bottom plate 60 connected to the main body 10. The plurality of elastic members 20, the plurality of resisting members 30, the plurality of adjusters 40, and the plurality of regulating nuts 50 can be assembled to the main body 10. Two elastic members 20 can be positioned on the two sides of one resisting member 30, and each elastic member can be mounted in the groove 11 at an angle relative to the bearing plate 12. Each adjuster 40 can be connected to a resisting member 30. Each regulating nut 50 can be connected to a adjuster 40, and can regulate the position of the resisting member 30.

Each groove 11 can include a bottom surface 111, an inclined sidewall 112, and a receiving portion 113. The receiving portion 113 can extend from the incline sidewall 112 to the main body 10.

Each elastic member 20 can include a fastening portion 21, an engaging portion 22, and a press portion 23. The fastening portion 21 can be perpendicularly connected to the engaging portion 22, and can be received into the receiving portion 113. The engaging portion 22 can protrude beyond the groove 11, and coupled to the incline sidewall 112 and be elastically deformed. The press portion 23 can be connected to the engaging portion 22, and can be configured to resist against a workpiece 200 (shown in FIG. 6). In the illustrated embodiment, the press portion 23 can be substantially arc-shaped, which can protect the workpiece 200 from damage.

Each resisting members 30 can be substantially bar-shaped, and can be received in a groove 11. The resisting member 30 can include two inclined surfaces 31 apart from the bottom surface 111 and a wedge-shaped groove 32, and the two inclined surfaces 31 can be symmetrically arranged on two sides of the resisting member 30. The inclined surface 31 can abut the engaging portion 22 of the elastic member 20, and the workpiece 200 can be sandwiched between the press portion 23 and the bearing plate 12. The wedge-shaped groove 32 can be defined on a surface of the resisting member 30 toward the bottom surface 111, and a cross section of the wedge-shaped groove 32 can be trapezoidal.

Each adjuster 40 can be substantially cylindrical, and include a coupling end 41, a connecting rod 42, and a first threaded portion 43. The coupling end 41 and the first threaded portion 43 can each be respectively connected to an end of the connecting rod 42.

Figure 3:
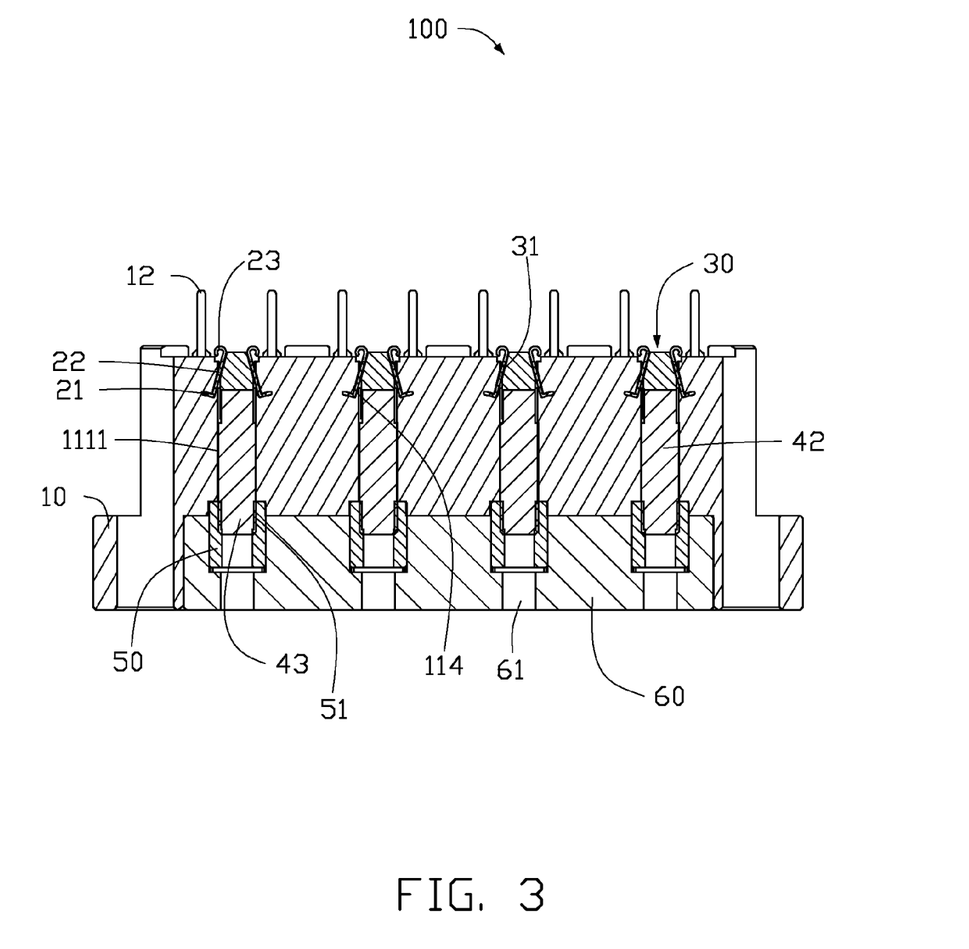
FIG. 3 is a cross-sectional view of the holding device taken along line III-III of FIG. 1.

FIG. 3 illustrates a cross-sectional view of the holding device 100. A plurality of through holes 1111 can be defined on the bottom surface 111, and the plurality of adjusters 40 can be received into the plurality of through holes 1111. Each groove 11 can also include a coupling portion 114 defined between the incline sidewall 112 and the receiving portion 113. The coupling portion 114 can be configured to limit the movement of the elastic member 20, to prevent the elastic member 20 from moving out of the receiving portion 113 (shown in FIG. 2).

The connecting rod 42 can be received into a through hole 1111. In the illustrated embodiment, a size of connecting rod 42 can be a little less than a size of the through hole 1111, which allows movement of the connecting rod 42 relative to the through hole 1111.

Each regulating nut 50 can include a second threaded portion 51 coupled to the first threaded portion 43 and the positions of the adjuster 40 and the resisting member 30 can be adjusted to apply or withdraw pressure by screwing the regulating nut 50 in or out. The bottom plate 60 can include a plurality of regulation holes 61, each regulation hole 61 can be configured to receive the regulating nut 50, to restrict access to the regulating nut 50 and prevent adjustments by mistake. When the plurality of the workpieces 200 needs to be fastened on the holding device 100, a regulation tool (not shown) can pass through the regulation hole 61, and can be configured to screw regulating nut 50 in or out.

The holding device 100 can also include a plurality of bolts (not shown), and bottom plate 60 can be connected to the main body 10 by the plurality of bolts.

Figure 4:
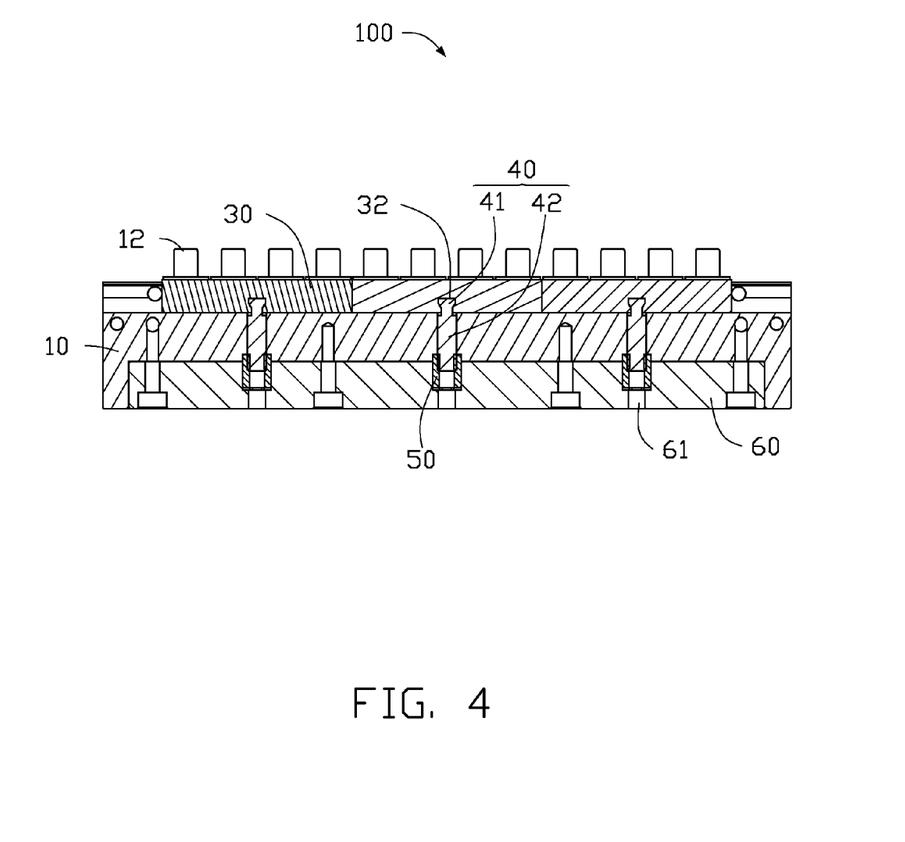
FIG. 4 is a cross-sectional view of the holding device taken along line IV-IV of FIG. 1.

FIG. 4 illustrates another cross-sectional view of the holding device 100. A cross section of the coupling end 41 can substantially trapezoidal, and a size of the cross section can be equal to a size of the wedge-shaped groove 32. The adjuster 40 can be connected to the resisting member 30 by the wedge-shaped groove 32 and the coupling end 41. In at least one embodiment, the adjuster 40 can be connected to the resisting member 30 by a bolt (not shown).

Figure 5:
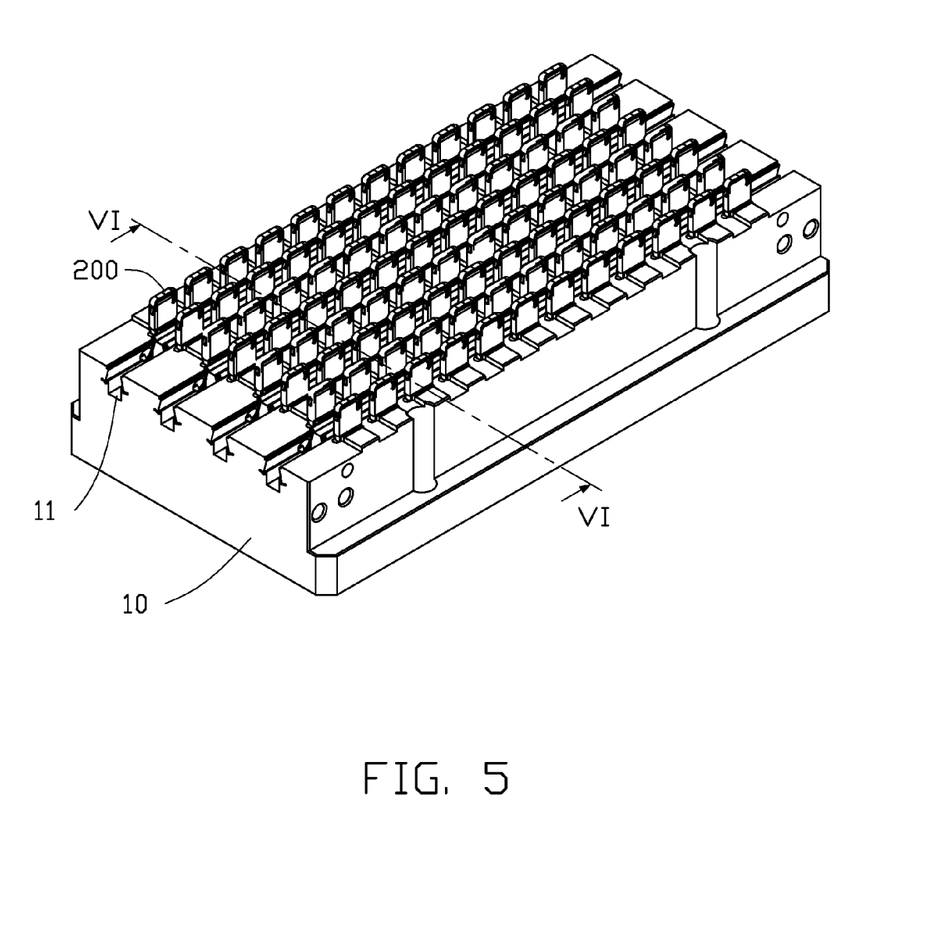
FIG. 5 is an isometric view of the holding device of FIG. 1 with a plurality of workpieces.

FIG. 5 illustrates an isometric view of the holding device 100 with a plurality of workpieces 200. The plurality of workpieces 100 can be uniformly distributed on the main body 10.

Figure 6:
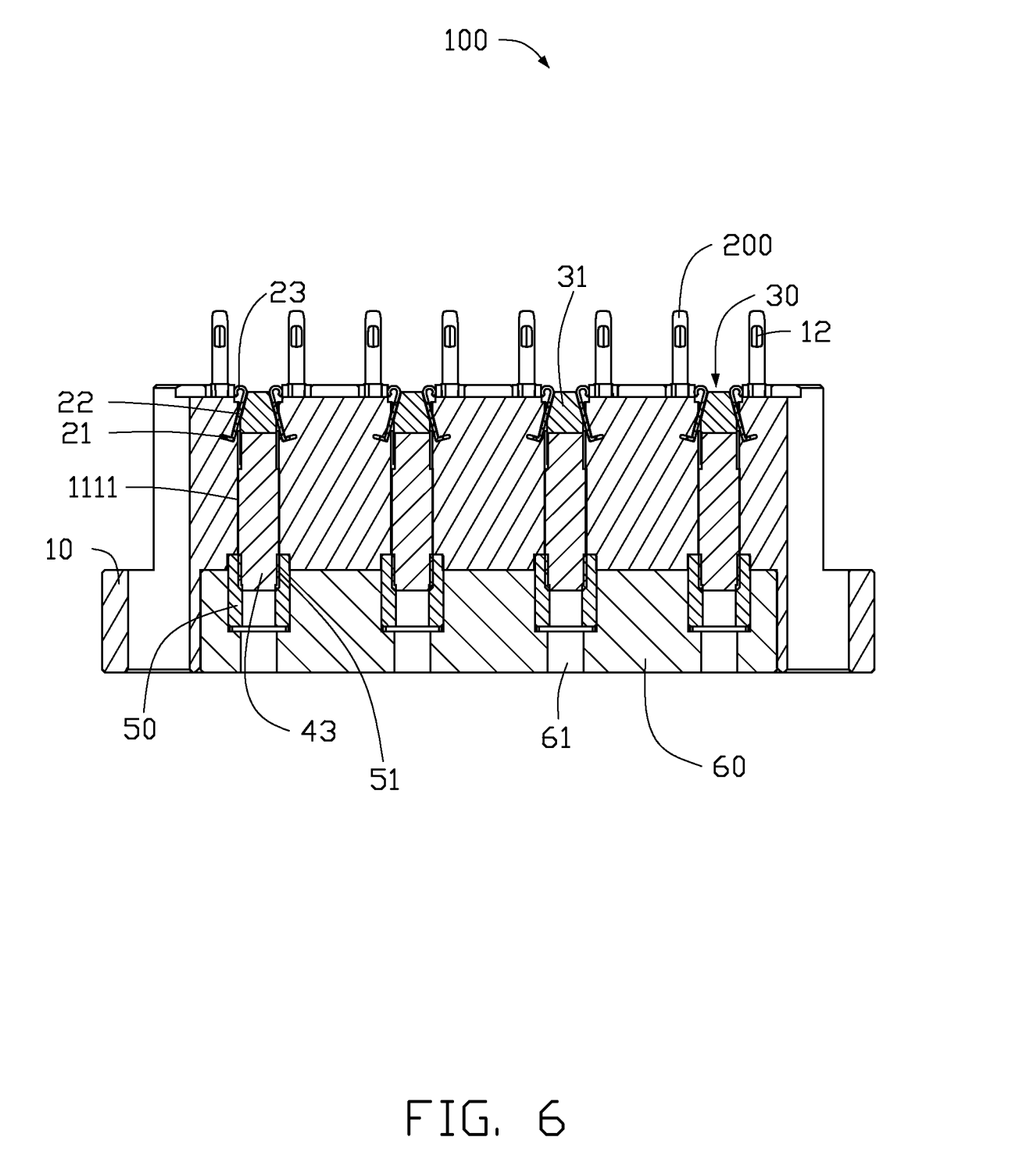
FIG. 6 is a cross-sectional view of the holding device taken along line VI-VI of FIG. 5.

FIG. 6 illustrates a cross-sectional view of the holding device 100 with a plurality of workpieces 200. Each bearing plate 12 can be surrounded by a workpiece 200.

In assembly, the coupling end 41 of the adjuster 40 can be assembled to the wedge-shaped groove 32 of the resisting member 30. Then, the adjuster 40 can be assembled to the through hole 1111, and the resisting member 30 can be received in the groove 11. The elastic member 20 can be assembled to the receiving portion 113 by a sidewall of the main body 10, and the engaging portion 22 can be sandwiched between the incline sidewall 112 and the receiving portion 113. The regulating nut 50 can be connected to the adjuster 40 by the first threaded portion 43 and the second threaded portion 51. Finally, the bottom plate 60 can be assembled to the main body 10 by the bolts (not shown), and the regulating nut 50 can be received into the regulation hole 61.

In operation, when the resisting member 30 rises it forces the engaging portion 22 of the elastic member 20 to move toward the bearing plate 12, thus securing the workpiece 200 when present. In detail, the workpieces 200 can be assembled to the bearing plates 12, the operator can screw the plurality of regulating nuts 50 in a clockwise direction. Then, each adjuster 40 can be held away from the regulating nut 50, and the inclined surface 31 can press against the engaging portion 22, to generate an elastic force. The press portion 23 holds the workpiece 200 firmly and stably in place by elastic force.

When the resisting member 30 lowers, the engaging portion moves away from the bearing plate 12, thus releasing the workpiece 200 when present. In detail, the operator can screw the plurality of regulating nut 50 in an anticlockwise direction. Then, each adjuster 40 can move towards the regulating nut 50, and the inclined surface 31 can be separated from the engaging portion 22. Thereby, the plurality of workpieces 200 can be released from the holding device 100.

As the inclined surface 31 is coupled to the engaging portion 22, the plurality of workpieces can be stably sandwiched between the press portion 23 and the bearing plate 12. The regulating nut 50 can be configured to control the resisting member 30, so the holding device 100 can not only fasten the workpieces but also release the workpieces. As the holding device 100 includes a plurality of bearing plates 12, fasten a plurality of workpieces 200 at the same time is convenient, and the processing efficiency of the workpiece 200 can be further improved.

The embodiments shown and described above are only examples. Many details are often found in the art such as the other features of a workpiece holding device. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A workpiece holding device comprising:
   a main body having a groove and a bearing plate configured to receive a workpiece;
   an elastic member mounted in the groove at an angle relative to the bearing plate, and having an engaging portion protruding beyond the groove;
   a resisting member having an inclined surface received in the groove, the inclined surface abutting the elastic member; and
   an adjuster configured to raise and lower the resisting member;
   wherein at least one through hole is defined on a bottom surface of the groove, and the adjuster is connected to the resisting member through the through hole;
   wherein when the resisting member rises, the resisting member forces the engaging portion of the elastic member to move toward the bearing plate, thus securing the workpiece when present; and
   wherein when the resisting member lowers, the engaging portion moves away from the bearing plate, thus releasing the workpiece when present.

2. The workpiece holding device of claim 1, further comprising a regulating nut below the resisting member, and the regulating nut is connected to the adjuster.

3. The workpiece holding device as claimed in claim 2, wherein the workpiece holding device further comprises a bottom plate assembled to the main body, and the bottom plate defines a regulating hole configured to receive the regulating nut.

4. The workpiece holding device as claimed in claim 2, wherein the adjuster comprises a coupling end, a connecting rod, and a first threaded portion, the coupling end and the first threaded portion can be respectively connected to two ends of the connecting rod.

5. The workpiece holding device as claimed in claim 4, wherein the resisting member comprises a wedge-shaped groove coupled to the coupling end.

6. The workpiece holding device as claimed in claim 4, wherein the regulating nut comprises a second threaded portion coupled to the first threaded portion, the positions of the adjuster and the resisting member can be adjusted to apply or withdraw pressure by tightening or loosening the regulating nut.

7. The workpiece holding device as claimed in claim 1, wherein the groove comprises a bottom surface, an incline sidewall, and a receiving portion, and the receiving portion extends from the incline sidewall to the main body.

8. The workpiece holding device as claimed in claim 7, wherein the coupling portion is positioned between the incline sidewall and the receiving portion, and the engaging portion is coupled to the incline sidewall.

9. The workpiece holding device as claimed in claim 7, wherein each elastic member further comprises a fastening portion perpendicularly connected to the engaging portion, and the fastening portion is assembled with the receiving portion.

10. The workpiece holding device as claimed in claim 1, wherein the bearing plate is positioned adjacent to the groove, and the bearing plate and the main body are formed integrally.

\* \* \* \* \*